United States Patent [19]
Anderson et al.

[11] Patent Number: 6,064,799
[45] Date of Patent: May 16, 2000

[54] METHOD AND APPARATUS FOR CONTROLLING THE RADIAL TEMPERATURE GRADIENT OF A WAFER WHILE RAMPING THE WAFER TEMPERATURE

[75] Inventors: Roger N. Anderson, San Jose; David K. Carlson, Santa Clara, both of Calif.

[73] Assignee: Applied Materials, Inc., Santa Clara, Calif.

[21] Appl. No.: 09/071,469

[22] Filed: Apr. 30, 1998

[51] Int. Cl.[7] ............................................. A21B 2/00
[52] U.S. Cl. ........................ 392/416; 392/418; 219/390; 219/411
[58] Field of Search .................... 438/795, 799; 392/416, 418; 118/725, 728, 50.1; 219/390, 411; 250/492.22, 492.23

[56] References Cited

U.S. PATENT DOCUMENTS

| | | | |
|---|---|---|---|
| 3,836,751 | 9/1974 | Anderson | 219/411 |
| 5,085,887 | 2/1992 | Adams et al. | 427/55 |
| 5,108,792 | 4/1992 | Anderson et al. | 427/248 |
| 5,179,677 | 1/1993 | Anderson et al. | 392/411 |
| 5,650,082 | 7/1997 | Anderson | 219/390 |

*Primary Examiner*—Teresa Walberg
*Assistant Examiner*—Shawntina Fuqua
*Attorney, Agent, or Firm*—Blakely Sokoloff Taylor & Zafman

[57] ABSTRACT

A method and apparatus for controlling the radial temperature gradients of a wafer and a susceptor while ramping the temperature of the wafer and susceptor using a first heat source that is primarily directed at a central portion of the wafer, a second heat source that is primarily directed at an outer portion of the wafer, a third heat source that is primarily directed at a central portion of the susceptor, and a fourth heat source that is primarily directed at an outer portion of the susceptor. Ramping of the wafer and susceptor temperature is accomplished by applying power to the first, second, third and fourth heat sources. During ramping, the ratio of the first and second heat source powers is varied as a function of the wafer temperature and the ratio of the third and fourth heat source powers is varied as a function of the susceptor temperature.

50 Claims, 13 Drawing Sheets

METHOD AND APPARATUS FOR CONTROLLING THE RADIAL TEMPERATURE GRADIENT OF A WAFER WHILE RAMPING THE WAFER TEMPERATURE

FIELD OF THE INVENTION

The field of our invention relates generally to semiconductor manufacturing, and more particularly to a method and apparatus for controlling the radial temperature distribution of a wafer while ramping the temperatures of the wafer.

BACKGROUND OF THE INVENTION

During the manufacturing of semiconductor devices, thin films are often formed on a wafer surface. A typical processing apparatus used to heat the wafers during this deposition or growth process is illustrated in FIG. 1. The processing apparatus used is often constructed so that a wafer 3 and a susceptor 5 may be heated from both sides by infrared radiation which is usually supplied by infrared lamps. The power to the heat sources, typically infrared lamps 1 and 7 may be adjusted so that the heat on the wafer side of the susceptor (typically the top side) is controlled separately from the heat on the opposing side of the susceptor (typically the bottom side) as illustrated in FIG. 1.

In the typical process apparatus, as shown in FIG. 1, power may be applied equally from the top and the bottom to heat the wafer 3 and the susceptor 5, respectively. Because the wafer 3 is thinner and has less thermal mass than the susceptor 5, the wafer 3 heats up at a much faster rate than the susceptor 5. This causes non-uniform heating of the wafer 3 and susceptor 5. In some cases, the wafer 3 can exceed the susceptor's temperature by more than 200° C. during a heat up which could damage the wafer 3.

One solution to overcome this problem is to control the power to the top and bottom heat sources separately. As shown in FIG. 1, one pyrometer 9 is used to detect the temperature of the wafer 3 and a second pyrometer 11 is used to detect the temperature of the susceptor 5, as illustrated in FIG. 1. A pyrometer is a device that is sensitive to infrared radiation. The pyrometer collects light emitted from a substrate and then determines the temperature of the substrate based on the light emitted. The power of the top and bottom heat sources is controlled separately by controllers 15 and 13, respectively. The temperature of the susceptor 5 is ramped to a process temperature by controlling the power to the second heat source 7 using conventional Proportional Integral Derivative (PID) algorithm temperature ramping which is well-known to those skilled in the art. The pyrometer 11 monitors the susceptor's 5 temperature which is used to control the amount of radiant energy flux applied by the second heat source 7 to the back surface of the susceptor 5.

A second pyrometer 9 monitoring the wafer's temperature is used to control the radiant energy flux to the wafer side of the susceptor 5. A processing control system 17, such as a microprocessor and memory, compares the wafer temperature to the susceptor temperature and then adjusts the power of the wafer's heat source 1 in an attempt to keep the wafer 3 at approximately the same temperature as the susceptor 5 during the temperature ramp. The temperature of the wafer 3 may be set to be slightly ahead or slightly behind the temperature of the susceptor during the ramp.

By controlling the top and bottom heat sources separately, the temperature difference between the wafer and susceptor may be more accurately controlled.

Over time, the diameter of the wafers being processed has steadily increased. In addition, there is a trend toward further miniaturization of electronic circuits formed on these wafers. Of particular concern is the uniformity of wafer temperature to ensure uniform results, e.g., deposition thickness, across the diameter of the wafer during processing. Although the prior art method of controlling the temperature of the wafer and susceptor permit the temperature difference between the wafer and susceptor to be more accurately controlled, it does not provide a means for controlling the radial temperature gradients between the central and outer portions of the wafer and susceptor.

Thus, what is needed is a method and apparatus which can control the radial temperature gradients of a wafer and/or susceptor while ramping the temperature of the wafer and/or susceptor.

SUMMARY OF THE INVENTION

A method and apparatus for controlling the radial temperature gradients of a wafer and a susceptor while ramping the temperature of the wafer and susceptor is disclosed.

In accordance with one embodiment, a first heat source is primarily directed at a central portion of the wafer, a second heat source is primarily directed at an outer portion of the wafer, a third heat source is primarily directed at a central portion of the susceptor, and a fourth heat source is primarily directed at an outer portion of the susceptor. Ramping of the wafer and susceptor temperature is accomplished by applying power to the first second, third and fourth heat sources. During ramping, the ratio of the first and second heat source powers is varied as a function of the wafer temperature and the ratio of the third and fourth heat source powers is varied as a function of the susceptor temperature.

BRIEF DESCRIPTION OF THE DRAWINGS

The present invention is illustrated by way of example and not a limitation in the Figures of the accompanying drawings in which like references indicate similar elements and in which.

DETAILED DESCRIPTION OF THE PRESENT INVENTION

A method and apparatus for controlling the radial temperature gradients of a wafer and a susceptor while ramping the temperature of the wafer and susceptor is disclosed. In the following description, numerous specific details are given to provide a thorough understanding of the invention, such as the use of a Proportional Integrated Derivative (PID) to ramp the temperature of the wafer and susceptor or the use of a pyrometer to detect the susceptor's temperature. However, it will be obvious to one of ordinary skill in the art that the invention may be practiced without these specific details. In other instances, well-known structures and processing steps have not been shown in particular detail in order to avoid unnecessarily obscuring the present invention.

Figure 1:
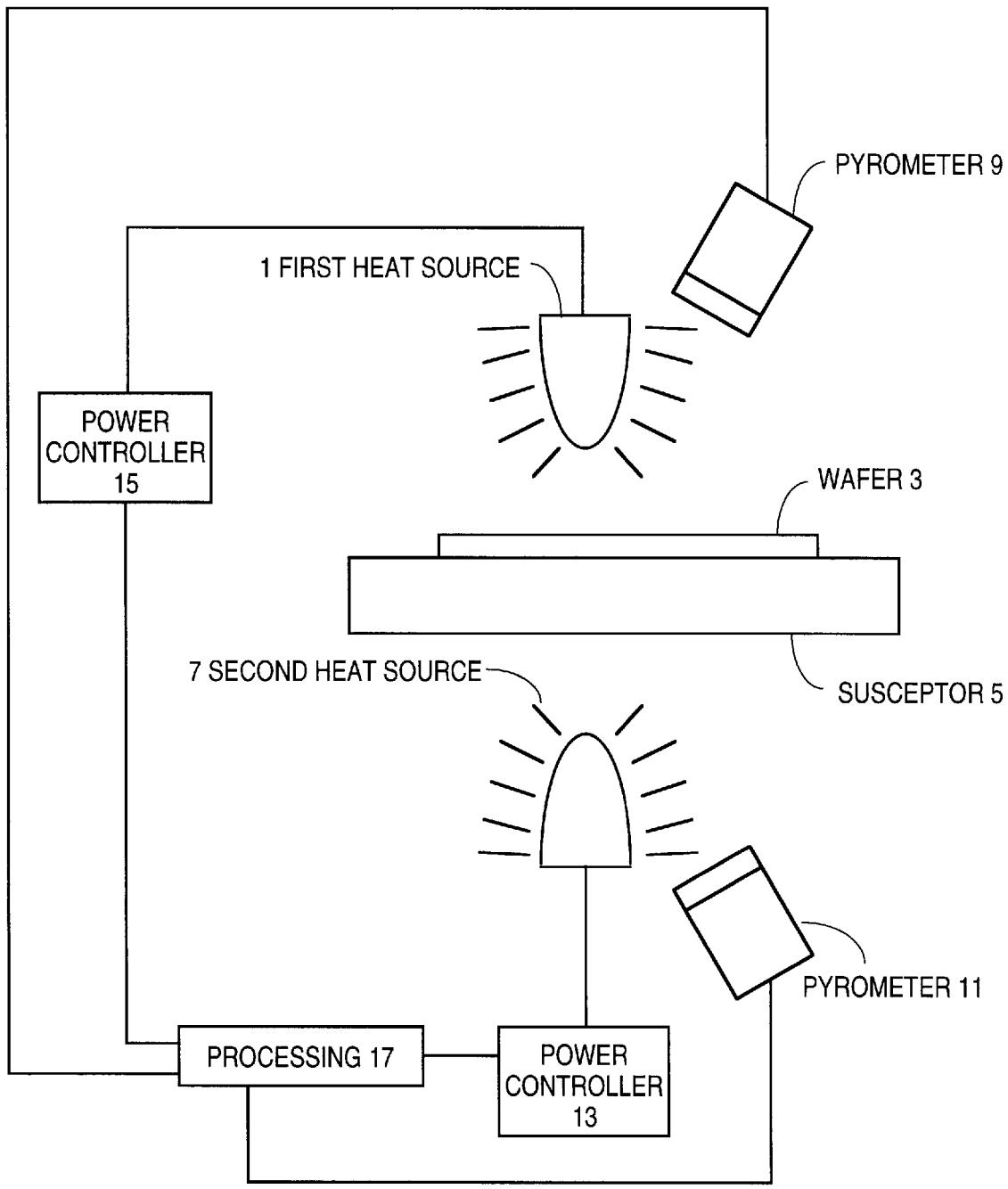
FIG. 1 is an example of a prior art processing apparatus used to heat a wafer and a susceptor during a temperature ramp.
Figure 2:
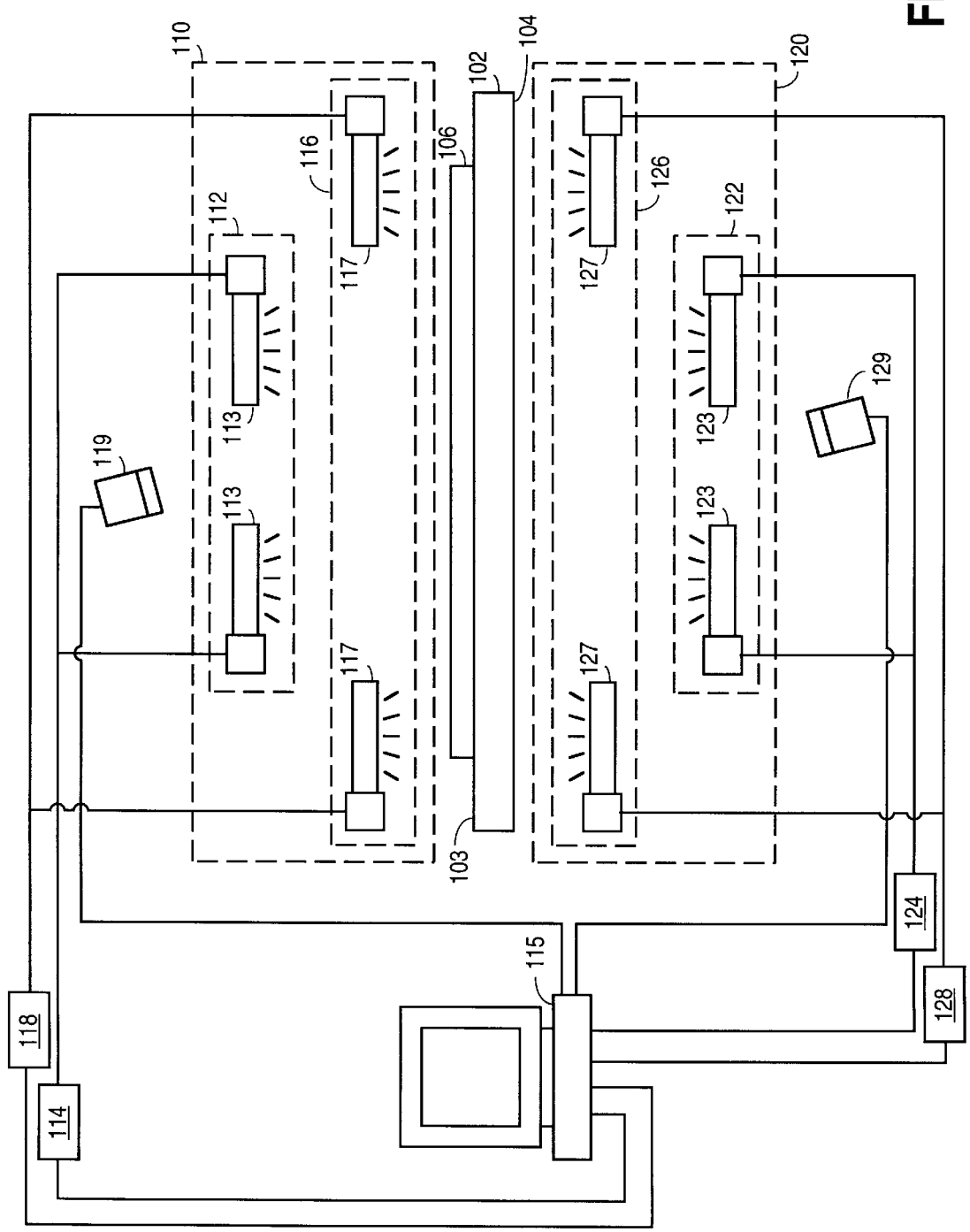
FIG. 2 is an illustration of a processing apparatus used to heat a wafer and a susceptor in one embodiment of the invention.

With reference to FIG. 2, an apparatus for ramping the temperature of a wafer 106 and susceptor 102 is shown. The susceptor 102 has an upper surface 103 and a lower surface 104. The upper surface 103 is configured to hold wafer 106 during the ramping process. In accordance with one embodiment, as illustrated in FIG. 2, there is provided a first heat assembly 110 located above susceptor 102 and a second heat assembly 120 located below the susceptor. Heat assembly 110 includes a first heat source 112 and a second heat source 116. The first heat source 112 has one or more infrared lamps 113 directed primarily at a central portion of the wafer 106. The second heat source 116 includes one or more infrared lamps 117 directed primarily at an outer portion of the wafer 106. The outer portion of the wafer is generally defined as that portion of the wafer residing nearer the edge of the wafer. Heat assembly 120 includes a third heat source 122 and a fourth heat source 126. The third heat source 122 includes one or more infrared lamps 123 directed primarily at a central portion of the lower surface 104 of susceptor 102. The fourth heat source 126 includes one or more infrared lamps 127 directed primarily at an outer portion of the lower surface 104 of susceptor 102. The outer portion of the susceptor is generally defined as that portion of the susceptor residing nearer the edge of the susceptor. Each of the first, second, third and fourth heat sources is controlled by a controller 114, 118, 124 and 128, respectively. The controllers 114, 118, 124 and 128 are, in turn, controlled by a computer 115, or other type of control system.

First and second temperature measuring devices 119 and 129 are used to determine the temperature of the wafer 106 and susceptor 102, respectively. While the temperatures of the wafer and susceptor are being ramped, computer 115 monitors the wafer 106 and susceptor 102 temperatures by taking samples utilizing pyrometers 119 and 129. Power to the heat sources is typically controlled by a proportional integral derivative (PID) algorithm on the computer 115. It is appreciated that other control methods may also be used.

As previously discussed, it is important to minimize the radial temperature gradients across the surface of the wafer 106 during processing in order to achieve uniform process results. In accordance with the present invention, radial temperature gradients are minimized during ramping of the wafer by using two or more heat sources on one or both sides of the susceptor, with each of the heat sources being primarily directed to different radial locations along the wafer and/or susceptor surfaces. In the embodiment of FIG. 2, heaters 113 of the first heat source 112 are primarily directed to the central portion of the wafer 106, whereas the heaters 117 of the second heat source 116 are primarily directed to an outer portion of the wafer. During ramping of the wafer from an initial temperature to a final temperature a first power, $P_1$, is applied to the first heat source 112, a second power, $P_2$, is applied to the second heat source 116, a third power, $P_3$, is applied to the third heat source 122, and a fourth power, $P_4$, is applied to the fourth heat source 126. The total power applied to the first heat assembly 110, $P_{total1}$, is $P_1+P_2$. The total power applied to the second heat assembly 120, $P_{total2}$, is $P_3+P_4$. In accordance with the present invention, the ratio of powers $P_1$ and $P_2$ and the ratio of powers $P_3$ and $P_4$ are varied during ramping of the wafer and susceptor in accordance with a predetermined set of power ratios stored in one or more look-up tables within computer 115. The ratio of powers $P_1$ and $P_2$ are provided as a function of the wafer temperature as measured by pyrometer 119. The ratio of powers $P_3$ and $P_4$ are provided as a function of the susceptor temperature as measured by pyrometer 129. Alternatively, the ratio of powers $P_1$ and $P_2$ and the ratio of powers $P_3$ and $P_4$ may be provided as a function of the susceptor temperature only or the wafer temperature only.

In FIG. 2, heaters 113 of the first heat source 112 are shown located in a radial position nearer the central portion of the wafer while heaters 117 of the second heat source 116 are shown located in a radial position nearer the outer portion of the wafer. It is important to note that the placement of the first and second heat source lamps is not limited to this configuration. For example, heaters 113 and 117 may be located in a single heater array. In such an embodiment, reflectors are used to direct heat from the heaters to different radial positions along the surface of the wafer.

One method of ramping the temperature of wafer 106 and susceptor 102 is to use a multiple step ramp sequence wherein the ratio of powers of $P_1$ and $P_2$ and the ratio of powers of $P_3$ and $P_4$ are varied one or more times while transitioning from an initial set of conditions to a final set of conditions. For example, when transitioning from a 650° C. initial temperature to a 1150° C. final temperature the power to each of the first, second, third and fourth heat sources may be varied according to the power ratio percentages listed in Table 1 below:

TABLE 1

|  | $P_{total1}$ | | $P_{total2}$ | |
| --- | --- | --- | --- | --- |
|  | $P_1$ | $P_2$ | $P_3$ | $P_4$ |
| 650° C. | 52% | 48% | 12.5% | 87.5% |
| Ramp 1 | 54% | 46% | 13.0% | 87.0% |
| Ramp 2 | 57% | 43% | 13.7% | 86.3% |
| Ramp 3 | 60% | 40% | 14.5% | 85.5% |
| 1150° C. | 62% | 38% | 15.0% | 85.0% |

At an initial wafer temperature of 650° C., 52% and 48% of the total power applied to heat assembly 110, $P_{total1}$, is distributed to the first heat source 112 and second heat source 116, respectively. Likewise, at an initial susceptor temperature of 650° C., 12.5% and 87.5% of the total power applied to heat assembly 120, $P_{total2}$, is distributed to the third heat source 122 and fourth heat source 126, respectively. During the ramping of the wafer and susceptor temperatures to a final temperature of 1150° C., the power ratios are varied a total of four times. As the temperature of the wafer 106 and susceptor 102 near 1150° C., the control system adjusts powers $P_1$, $P_2$, $P_3$, and $P_4$ to their final power ratio setpoints of 62%, 38%, 15% and 85%, respectively.

It is generally desirable that the power ratios be set so that the wafer 106 and susceptor 102 reach equilibrium temperature at essentially the same time. The total power, $P_{TOTAL}$, applied to the system is the sum of the powers being applied to heat assemblies 110 and 120. That is, $P_{TOTAL} = P_{total1} + P_{total2}$. One way of achieving nearly simultaneous wafer and susceptor equilibrium temperature is to also vary the ratio of powers to the first and second heat assemblies 110 and 120 during the temperature ramp.

It is should be noted that power ratios listed in Table 1 are provided for illustrative purposes only. The power ratios are dependent upon a number of variables. These include, but are not limited to: 1) the heat source configuration, 2) susceptor geometry and thermal mass, 3) wafer size and thermal mass, 4) the overall design of the thermal reactor and, 5) process variables, such as process gas flow and process gas temperature.

Another method of ramping the temperature of the wafer 106 and susceptor 102 is to employ software that continuously adjust the power ratios between the inner and outer lamps. For instance, in lieu of using the multiple step ramp sequence of Table 1, the power being applied to each of the heat sources may be varied linearly from an initial power ratio at 650° C. to a final power ratio at 1150° C. As an example, when the temperature of the wafer and/or susceptor is at 900° C., the ratio of powers $P_1$ and $P_2$ is 58%/42% while the ratio of powers $P_3$ and $P_4$ is 13.75%/86.25%. Again, as the temperature of the wafer 106 and susceptor 102 near 1150° C., the control system adjusts powers $P_1$, $P_2$, $P_3$, and $P_4$ to their final power ratio setpoints of 62%, 38%, 15% and 85%, respectively.

Generally, the look-up tables in computer 115 are produced using a series of calibration steps. The calibration steps typically involve applying power to the heat sources and simultaneously measuring the temperature of a test wafer and/or susceptor at various radial locations. Thermocouples attached to or embedded within the test wafer and/or susceptor are typically used to provide precise temperature indication during the calibration steps. Values obtained during calibration are used to define power/temperature calibration curves for each heat source using one or more mathematical equations. Software within a program storage device uses these mathematical equations to generate the look-up table(s) that are stored in computer 115.

The power ratios may also be varied in a non-linear fashion while ramping the temperature of the wafer 106 or susceptor 102. In some instances, varying the power ratios in a non-linear fashion may be desirable as a means of minimizing radial thermal gradients and/or reducing ramp time.

The computer 115, a type of control system, shown in FIG. 2 is defined as having a processor, a memory and an input and output device. A computer program stored in memory determines and controls the power provided to the first, second, third and fourth heat sources. Although a computer 115, is shown performing a processing function by monitoring the susceptor and wafer temperatures and thus determining and controlling the temperature of the wafer 106 and susceptor 102, other possibilities exist. For example, one could use an Application-Specific Integrated Circuit (ASIC) device, Programmable Logic Device (PLD), or hard wire logic circuits.

It is important to note that the present invention is not limited to any specific heat source configuration, nor is the invention limited to the use of only two heat sources to distribute heat radially along the surface of the wafer and susceptor. It is contemplated that the use of three or more heat sources that are directed at different radial locations of the wafer and susceptor may be used in order to achieve a more precise control of the radial temperature gradients. Moreover, it is important to note that the present invention is not limited to a single temperature measuring device located above the susceptor and a single temperature measuring device located below the susceptor 102. In some instances, multiple temperature measuring devices may be used to measure the temperature of the wafer and/or susceptor at different radial locations. Further, it is appreciated that the present invention is not limited to the use of infrared lamps. Other heat sources may also be used.

Figure 7:
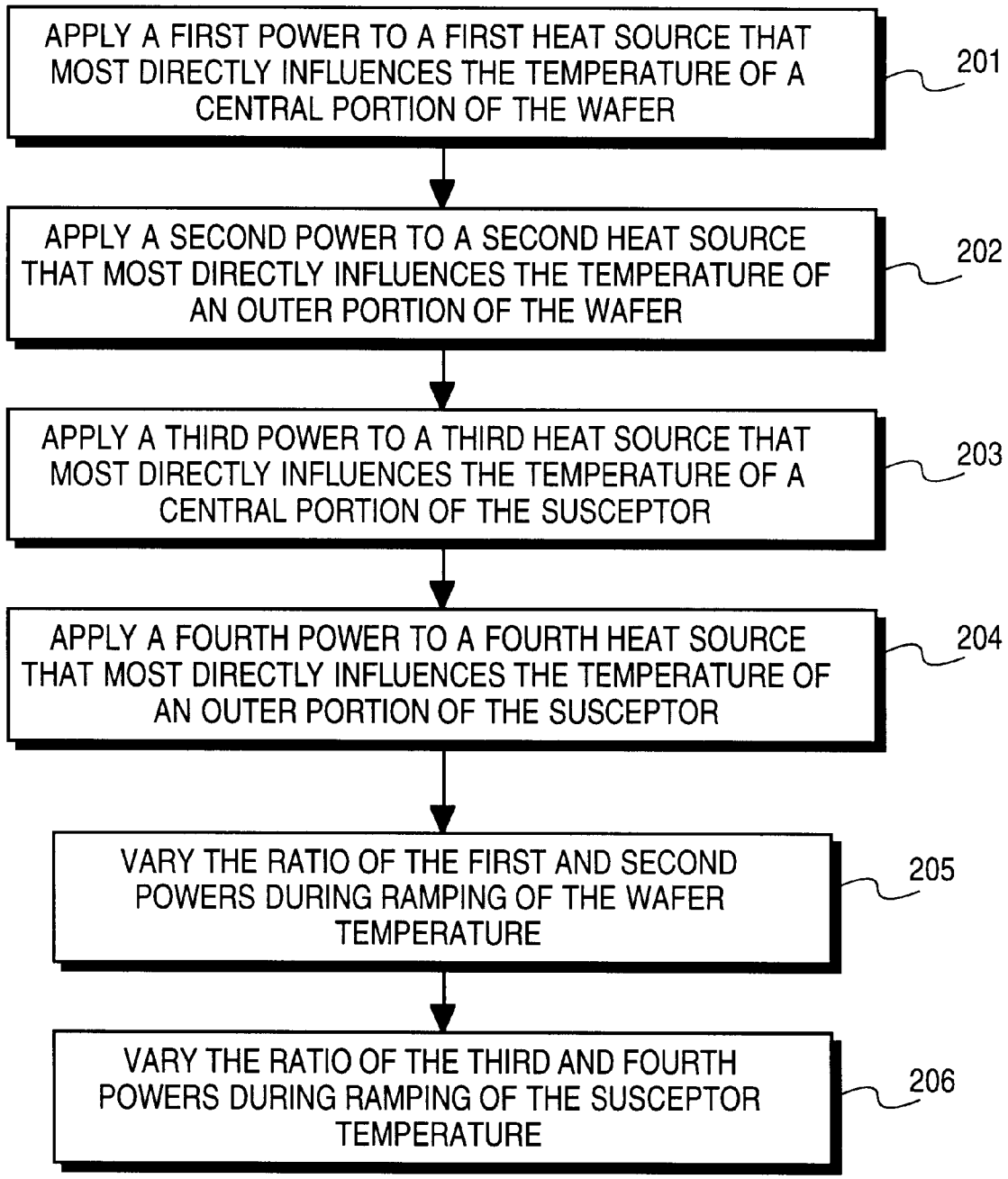
FIG. 7 is a flow chart illustrating a method of ramping the temperature of a wafer and susceptor in one embodiment of the present invention.

FIG. 7 is a flow chart illustrating one method of ramping the temperatures of the susceptor 102 and wafer 106 using the apparatus of FIG. 2. The first steps as illustrated in Blocks 201–204 of FIG. 7, are to 1) apply a first power to the first heat source 112 to influence the temperature of the central portion of the wafer 106, 2) apply a second power to the second heat source 116 to influence the temperature of the outer portion of the wafer 106, 3) apply a third power to the third heat source 122 to influence the temperature of the central portion of the susceptor 102 and, 4) apply a fourth power to the fourth heat source 126 to influence the temperature of the outer portion of the susceptor 102. During ramping of the wafer and susceptor temperatures, the ratio of the first and second powers and the ratio of the third and fourth powers is varied as illustrated in Blocks 205 and 206. It should be noted that the ramping of the wafer and susceptor temperature may include a heating step where the temperature of the wafer and susceptor are increased during the ramp, or conversely, may include a cooling step where the temperature of the wafer and susceptor are decreased during the ramp.

Figure 8:
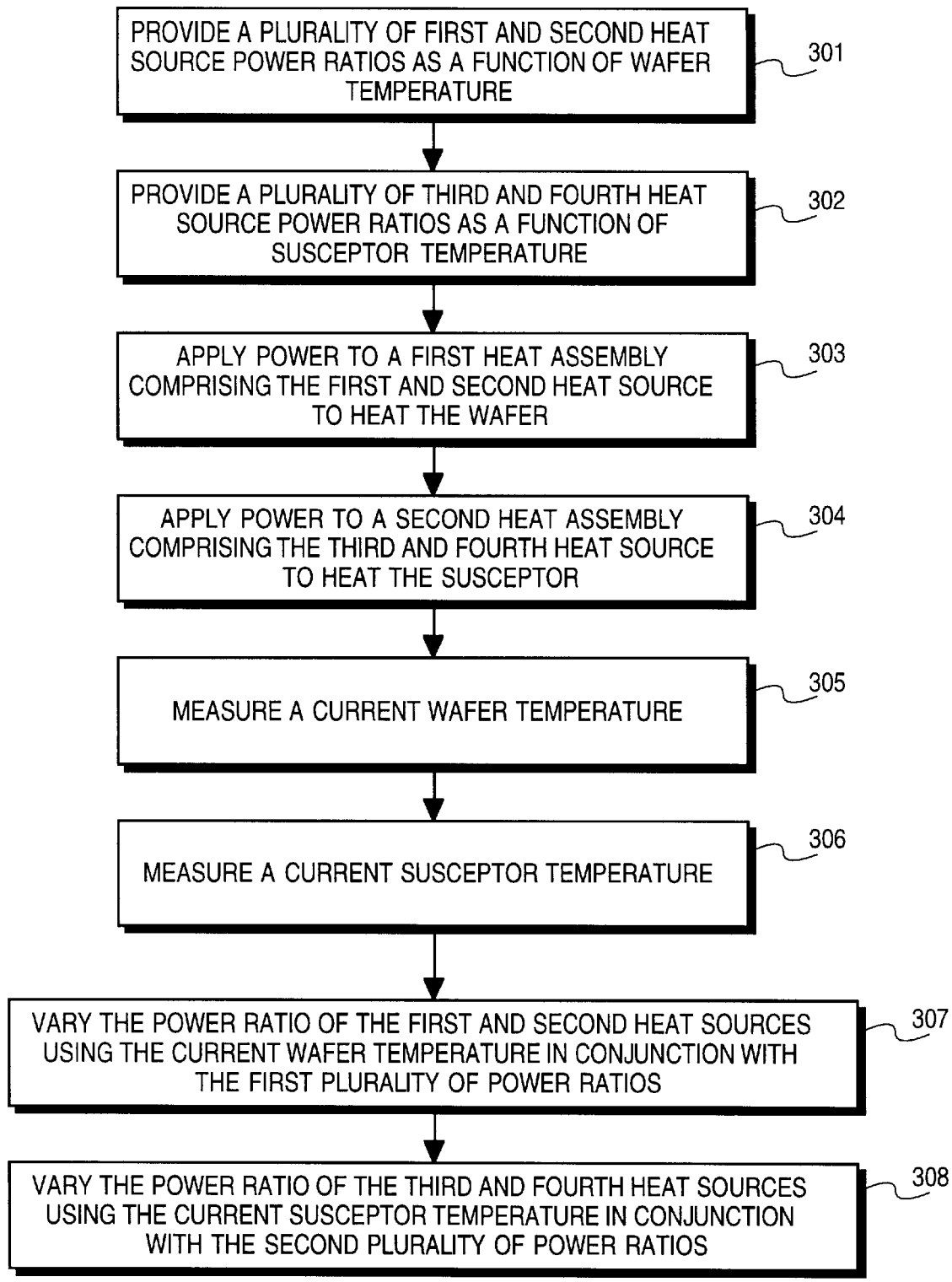
FIG. 8 is a flow chart illustrating a method of ramping the temperature of a wafer and susceptor in another embodiment of the present invention.

FIG. 8 is a flow chart illustrating another ramping method. The first steps, as illustrated in Blocks 301 and 302, are to 1) provide a plurality of first heat source 112 and second heat source 116 power ratios as a function of the wafer 106 temperature and 2) provide a plurality of third heat source 122 and fourth heat source 126 power ratios as a function of the susceptor temperature 102. As discussed above, these values are typically provided within look-up tables stored in computer 115. Power is then applied to the first heat assembly 110 and the second heat assembly 120, as illustrated in Blocks 303 and 304. As previously described, the first heat assembly 110 includes heat sources 112 and 116, and the second heat assembly 120 includes heat sources 122 and 126. As the temperature of the wafer and susceptor are being ramped the wafer and susceptor temperature are measured as indicated in Blocks 305 and 306. As noted above, in one embodiment the temperature measuring devices include a first pyrometer 119 for measuring the temperature of the wafer 106 and a second pyrometer 129 for measuring the temperature of the susceptor 102. It is to be understood, however, that the present invention is not limited to any specific type of temperature measuring device. While ramping the wafer temperature the power ratio of the first and second heat sources 112 and 116 is varied using the current wafer temperature obtained in Block 305 in conjunction with the first plurality of power ratios provided in Block 301. Likewise, while ramping the susceptor temperature the power ratio of the third and fourth heat sources 122 and 126 is varied using the current susceptor temperature obtained in Block 306 conjunction with the second plurality of power ratios provided in Block 302.

Figure 9:
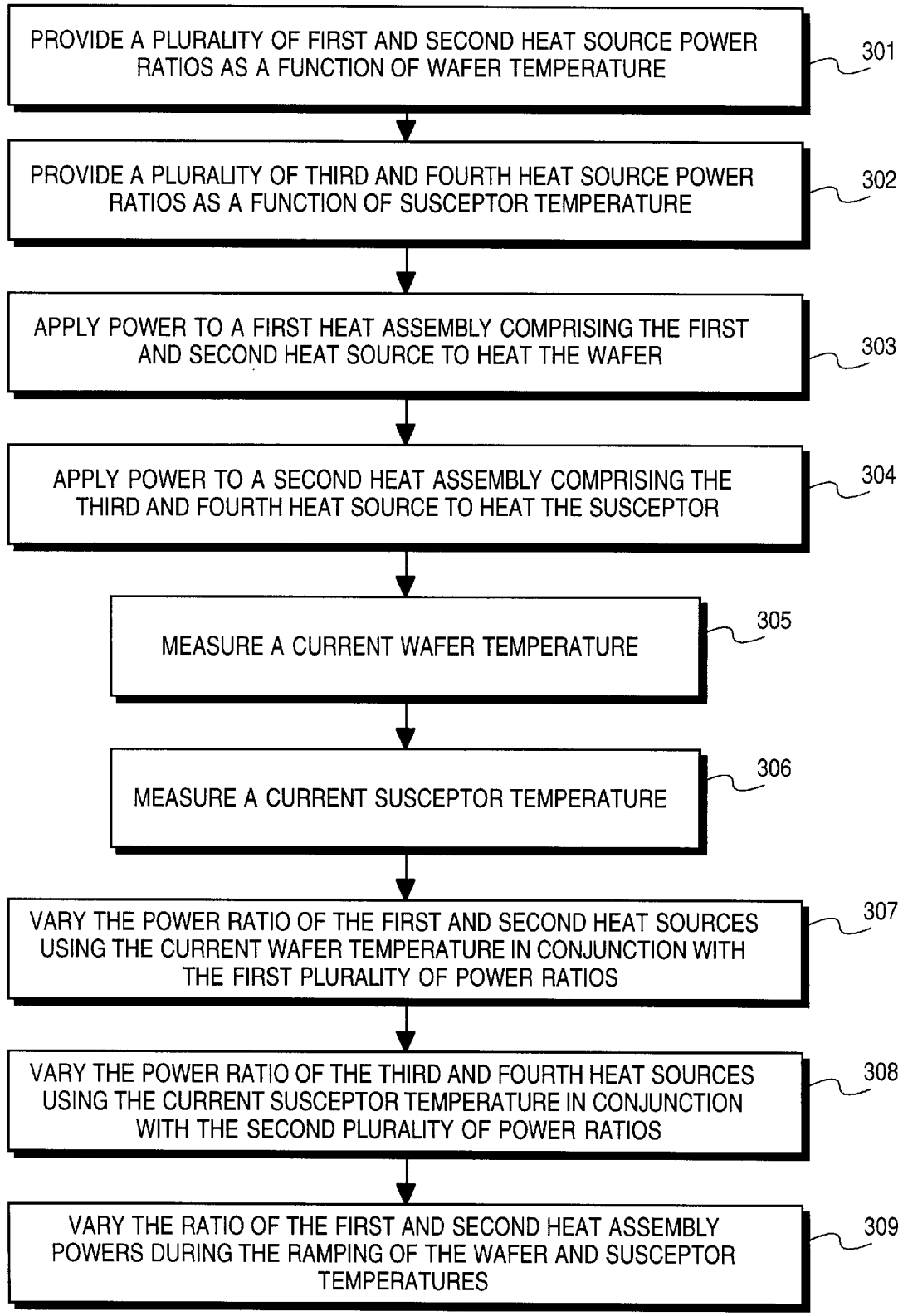
FIG. 9 is a flow chart illustrating a method of ramping the temperature of a wafer and susceptor in yet another embodiment of the present invention.

In an alternative embodiment, and as illustrated in the flow chart of FIG. 9, the ratio of the first heat assembly power, $P_{total1}$, and second heat assembly, $P_{total2}$, is also varied during the ramping of the wafer and susceptor temperature. That is, the power provided to the first heat assembly 110 and second heat assembly 120 may be different percentages of the total power, $P_{TOTAL}$, provided to both heat assemblies.

Figure 3:
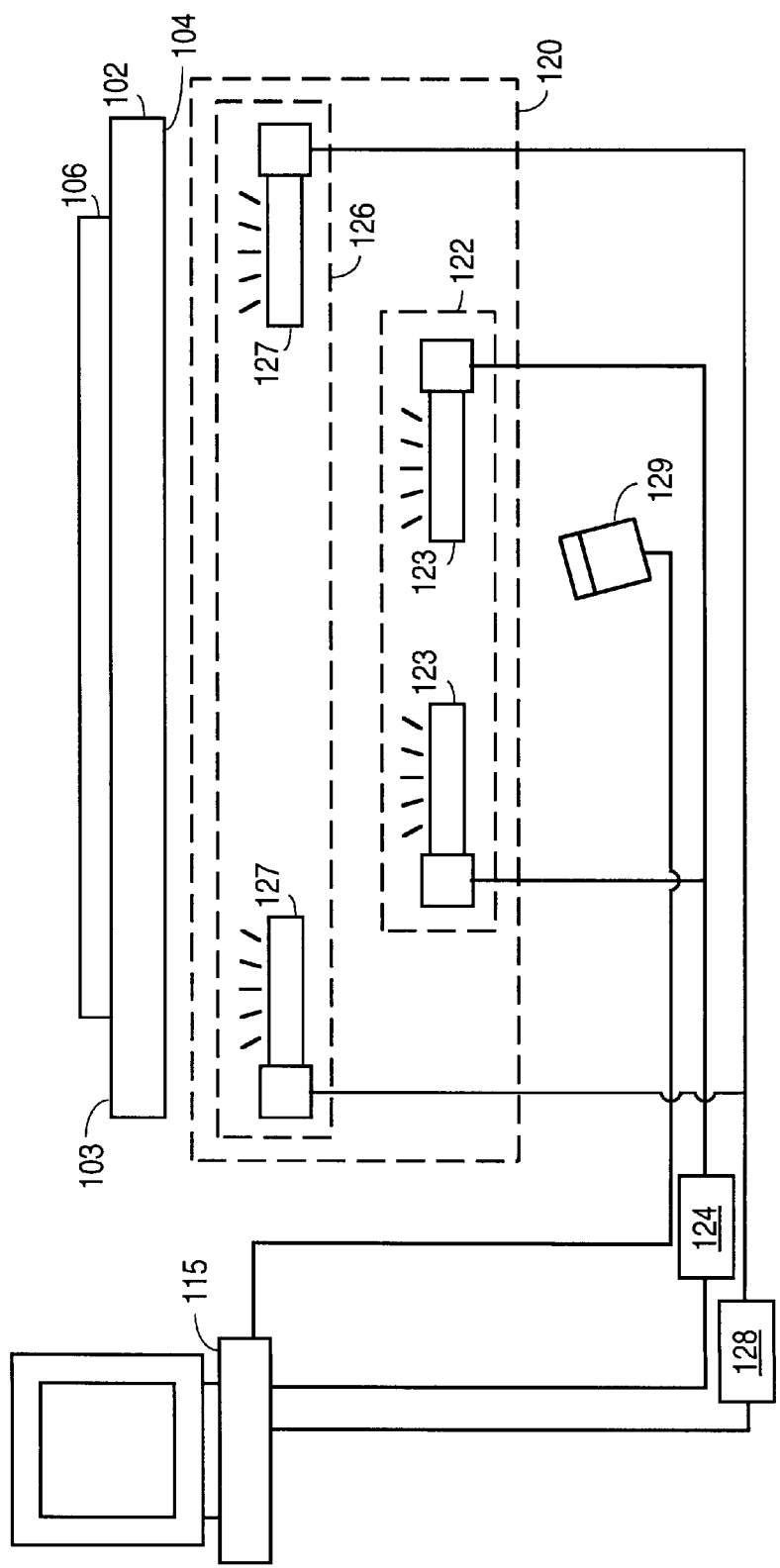
FIG. 3 is an illustration of a processing apparatus used to heat a susceptor in one embodiment of the invention.
Figure 10:
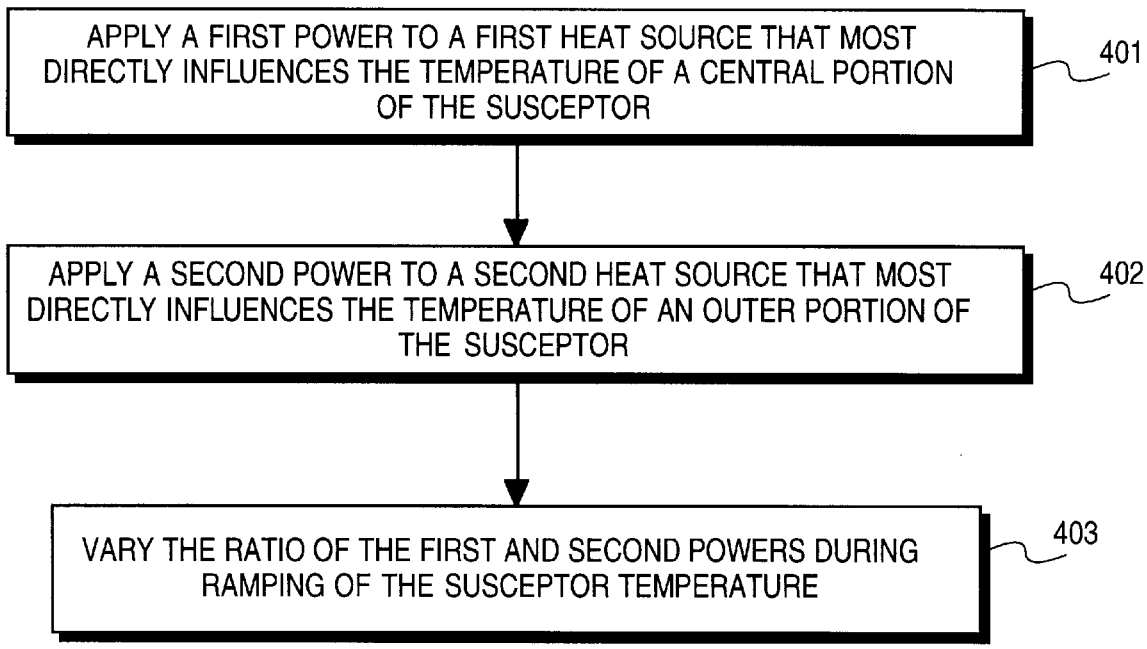
FIG. 10 is a flow chart illustrating a method of ramping the temperature of a susceptor in one embodiment of the present invention.

In the previously described embodiments a first heat assembly 110 is provided for primarily heating the wafer 106 positioned on the upper surface 103 of susceptor 102. A second heat assembly 120 is also provided for primarily heating the lower surface 104 of the susceptor 102. In some instances, however, it may not be necessary to provide two separate heat assemblies in order to effectuate the ramping of the susceptor 102 and wafer 106. As shown in FIG. 3, ramping of the susceptor and wafer temperatures may be achieved by using only the lower heat assembly 120. Since the susceptor 102 is typically made of a thermally conductive material, heat imposed upon the lower surface 104 of the susceptor is conducted to the upper surface 103 and to wafer 106. Therefore, in accordance with one embodiment, ramping of the susceptor and wafer temperature is achieved by applying a first power to heat source 122 and a second power to heat source 126 and varying the ratio of the first and second powers during the ramping sequence. Blocks 401–403 of FIG. 10 illustrate the steps of ramping the susceptor temperature using the apparatus of FIG. 3. In the apparatus of FIG. 3, the power ratios are varied using a current temperature of the susceptor as measured by pyrometer 129. The power ratios may also be varied using temperature measurements of the wafer 106 or a combination of wafer and susceptor temperatures. Moreover, the power ratios may be varied in accordance with a current temperature measurement of the susceptor and/or wafer, or may alternatively be varied in accordance with predicted susceptor and/or wafer temperature values.

Figure 4:
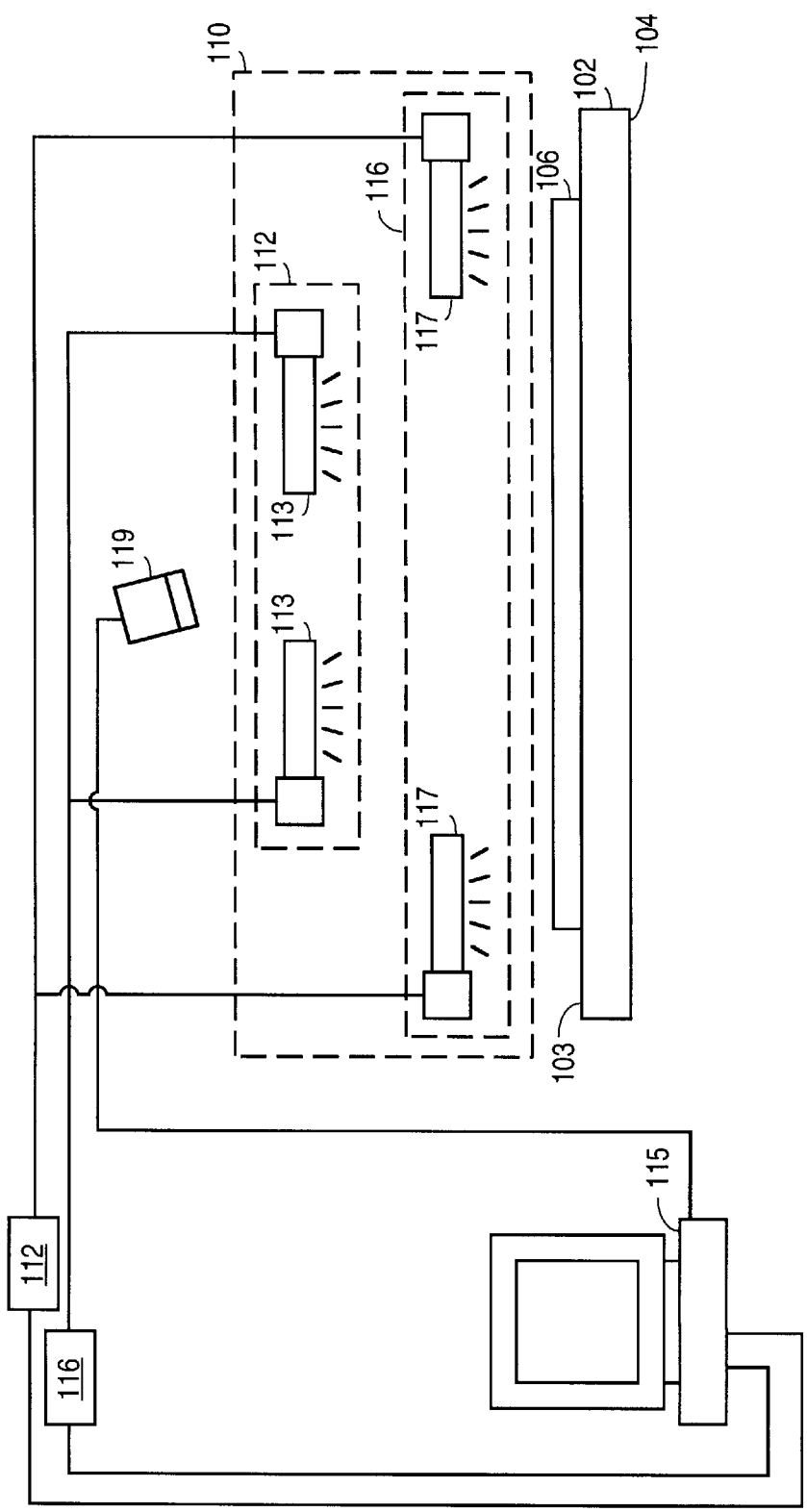
FIG. 4 is an illustration of a processing apparatus used to heat a wafer in one embodiment of the invention.
Figure 11:
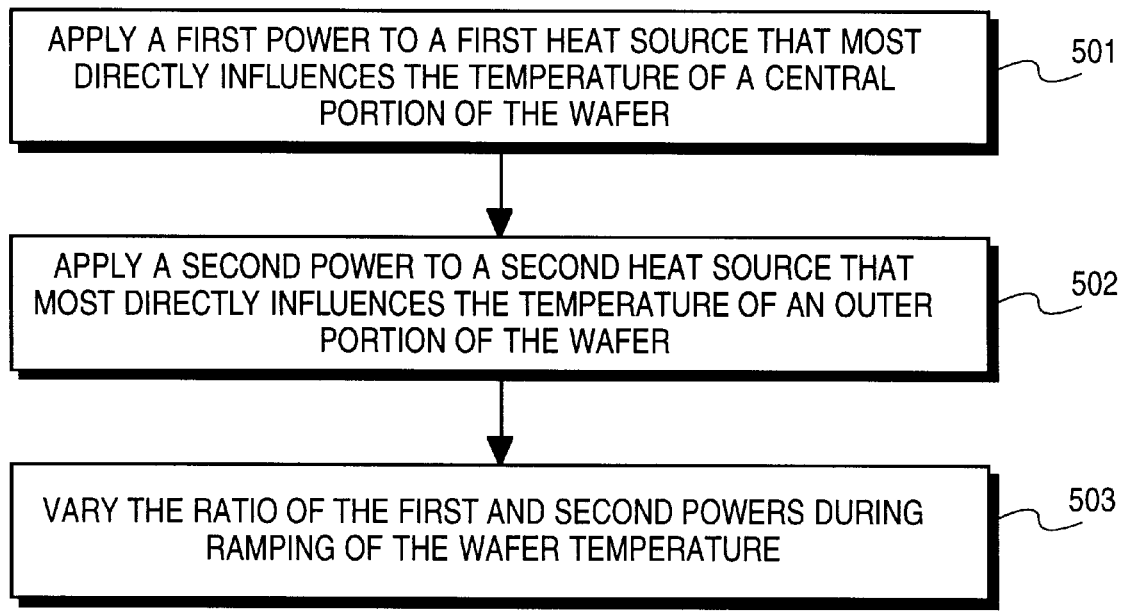
FIG. 11 is a flow chart illustrating a method of ramping the temperature of a wafer in one embodiment of the present invention.

Turning now to FIG. 4, an apparatus is shown wherein the temperature of the wafer 106 and susceptor 102 is ramped using only the upper heat assembly 110. Ramping of the wafer is accomplished by applying a first power to heat source 112 and a second power to heat source 116 and varying the ratio of the first and second powers during the ramping sequence. Blocks 501–503 of FIG. 11 illustrate the steps of ramping the wafer temperature using the apparatus of FIG. 4. In the apparatus of FIG. 4, the power ratios are varied using a current temperature of the wafer as measured by pyrometer 119. It is appreciated, however, that the power ratios may also be varied in response to the susceptor temperature.

Figure 5:
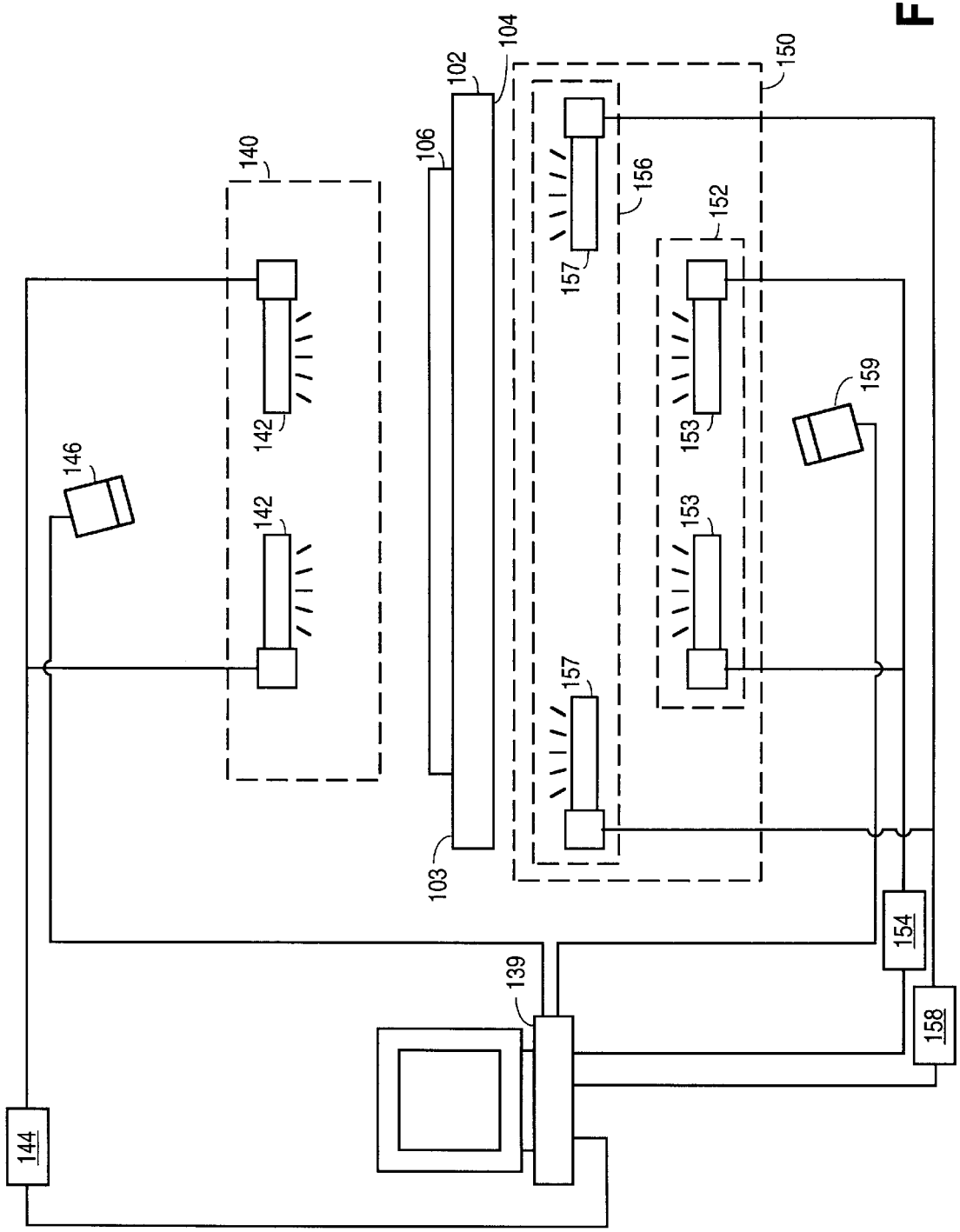
FIG. 5 is an illustration of a processing apparatus used to heat a wafer and a susceptor in another embodiment of the invention.

With reference to FIG. 5, another apparatus for ramping the temperature of susceptor 102 and wafer 106 is shown. As previously described, the susceptor 102 has an upper surface 103 and a lower surface 104. The upper surface 103 is configured to hold wafer 106 during the ramping process. In accordance with the embodiment, as illustrated in FIG. 5, there is provided a first heat assembly 140 located above susceptor 102 and a second heat assembly 150 located below the susceptor. Heat assembly 140 includes a first heat source in the form of one or more infrared lamps 142 that are directed generally toward the upper surface 103 of the susceptor. Heat assembly 150, on the other hand, includes at least a second heat source 152 and a third heat source 156. The second heat source 152 includes one or more infrared lamps 153 directed primarily at a central portion of the lower surface 104 of susceptor 102. The third heat source 156 includes one or more infrared lamps 157 directed primarily at an outer portion of the lower surface 104 of susceptor 102. Each of the first, second and third heat sources is controlled by a controller 144, 154 and 158, respectively. The controllers 144, 154 and 158 are, in turn, controlled by a computer 139.

Figure 12:
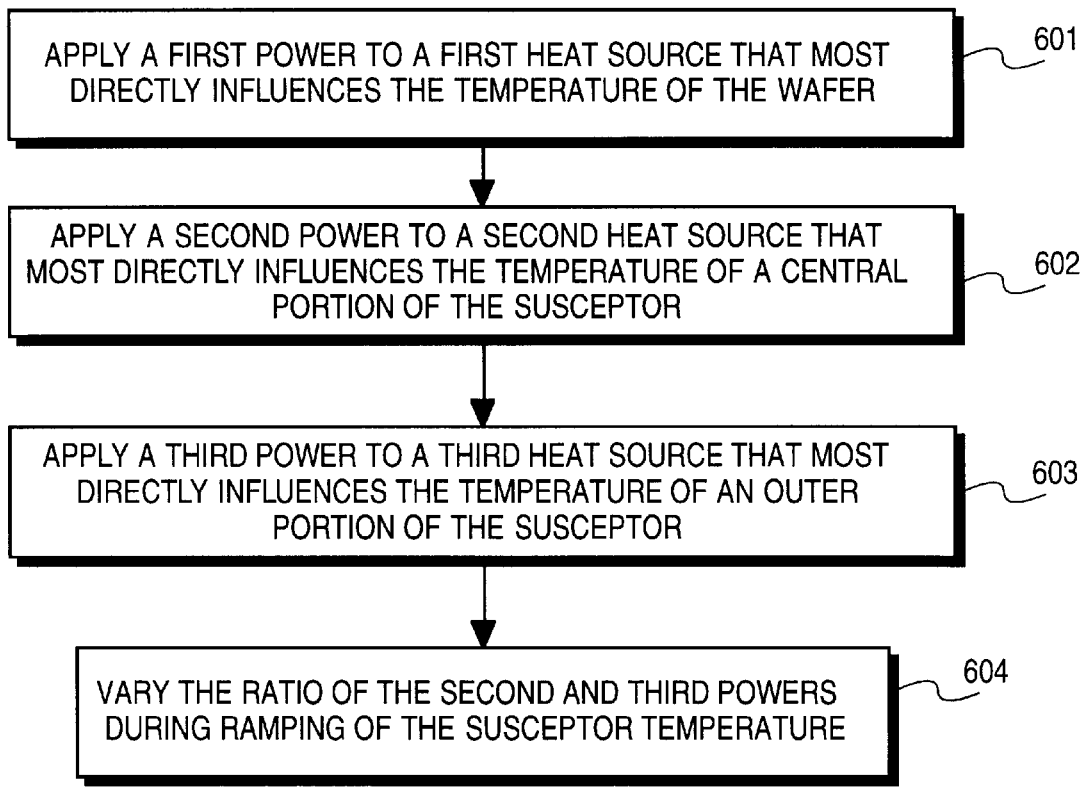
FIG. 12 is a flow chart illustrating a method of ramping the temperature of a wafer and susceptor in another embodiment of the present invention.

First and second temperature measuring devices 146 and 159 are used to determine the temperature of the wafer 106 and susceptor 102. While the temperatures of the wafer and susceptor are being ramped, computer 139 monitors the wafer 106 and susceptor 102 temperatures by taking samples utilizing pyrometers 146 and 159. Power to the heat sources is typically controlled by a proportional integral derivative (PID) algorithm on the computer 139. Ramping of the wafer and susceptor temperatures is accomplished by applying a first power to lamps 142, a second power to lamps 152 and a third power to lamps 157 and varying the ratio of the second and third powers during the ramping sequence. Blocks 601–604 of FIG. 12 illustrate the steps of ramping the wafer and susceptor temperatures using the apparatus of FIG. 5.

Figure 6:
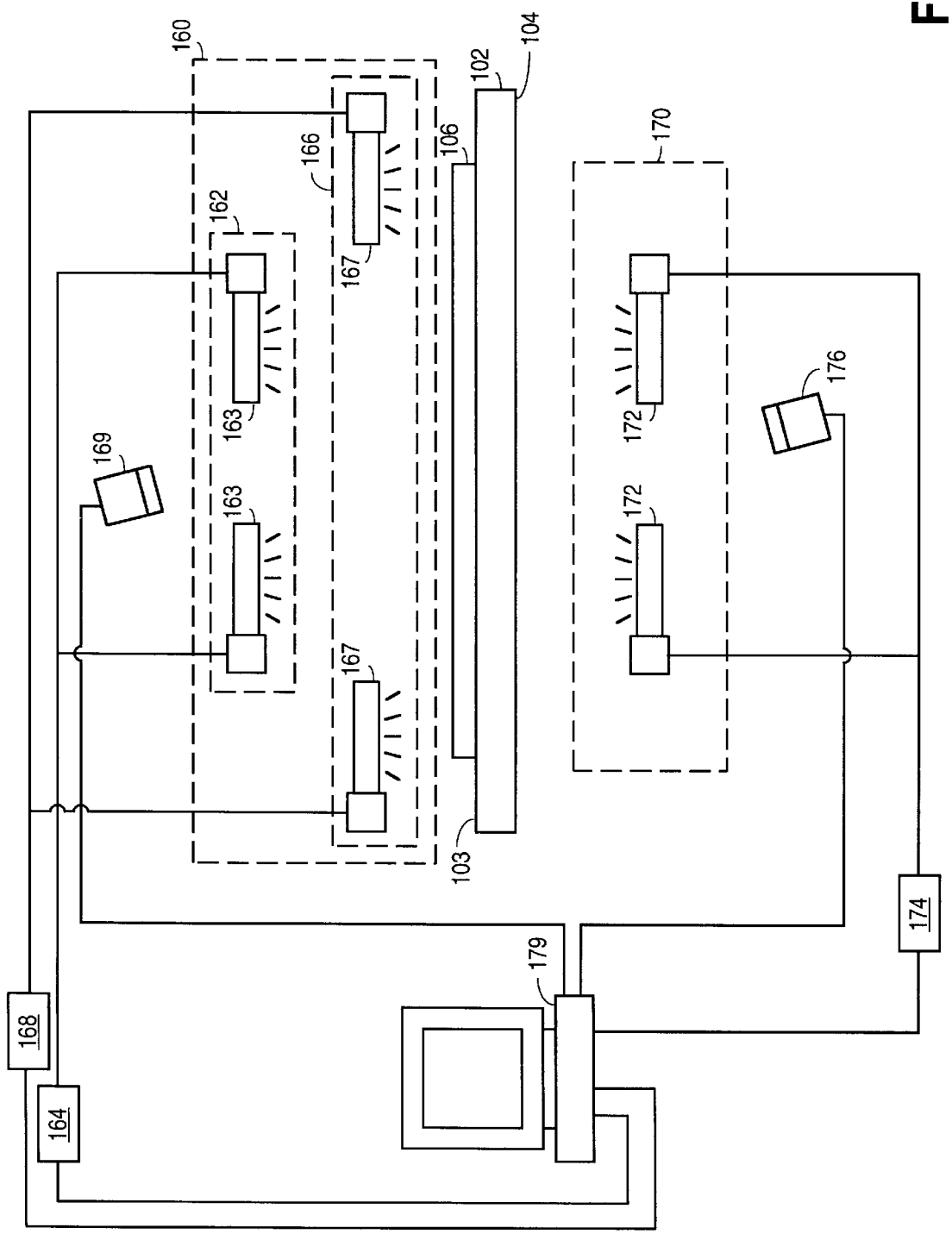
FIG. 6 is an illustration of a processing apparatus used to heat a wafer and a susceptor in yet another embodiment of the invention.

With reference to FIG. 6, another apparatus for ramping the temperature of susceptor 102 and wafer 106 is shown. In accordance with the embodiment of FIG. 6, there is a first heat assembly 160 that includes at least a first heat source 162 and a second heat source 166. The first heat source 162 includes one or more infrared lamps 163 directed primarily toward a central portion of the upper surface 103 of susceptor 102. Note that, in the embodiment illustrated, the central portion of the wafer corresponds with the central portion of the susceptor. The second heat source 166 includes one or more infrared lamps 167 directed primarily at an outer portion of the upper surface 104 of susceptor 102. A second heat assembly 170 is located below susceptor 102. Heat assembly 170 includes a third heat source in the form of one or more infrared lamps 172 that are directed generally toward the lower surface 104 of the susceptor. Each of the first, second and third heat sources is controlled by a controller 164, 168 and 174, respectively. The controllers 164, 168 and 174 are, in turn, controlled by a computer 179.

Figure 13:
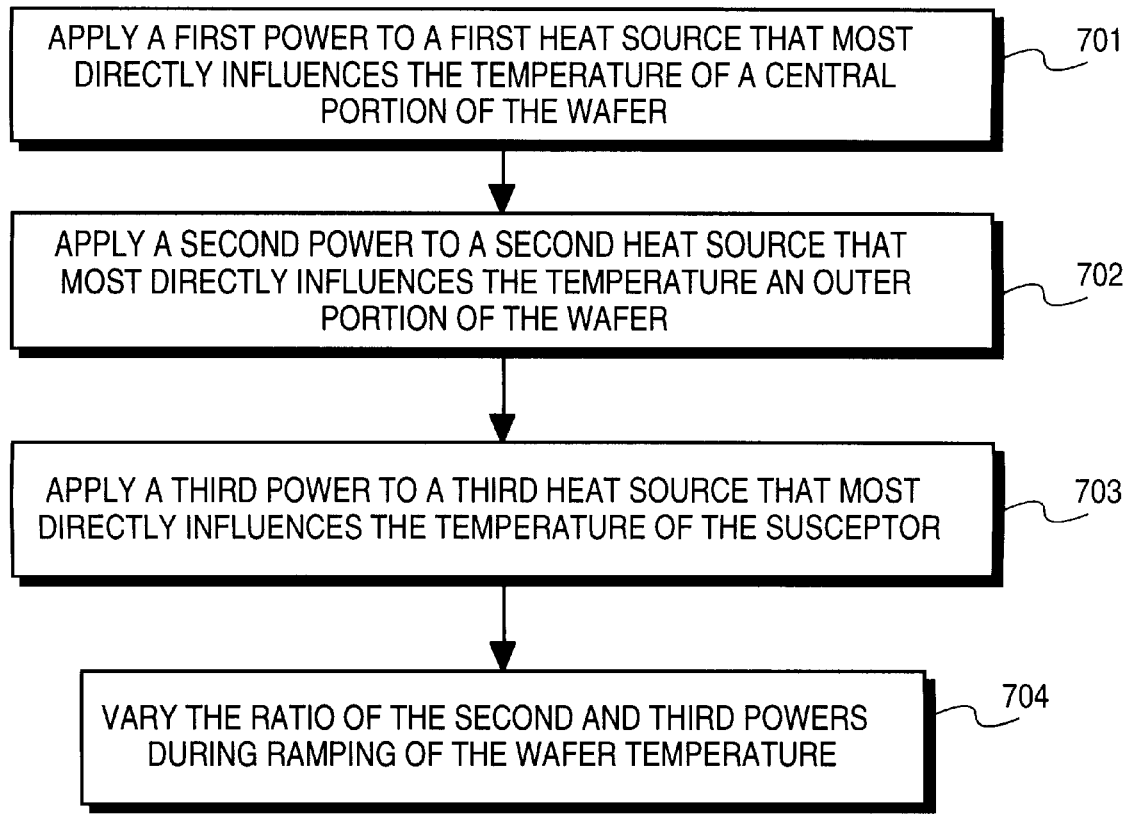
FIG. 13 is a flow chart illustrating a method of ramping the temperature of a wafer and susceptor in yet another embodiment of the present invention.

First and second temperature measuring devices 169 and 176 are used to determine the temperature of the wafer 106 and susceptor 102. While the temperatures of the wafer and susceptor are being ramped, computer 179 monitors the wafer 106 and susceptor 102 temperatures by taking samples utilizing pyrometers 169 and 176. Ramping of the wafer and susceptor temperatures is accomplished by applying a first power to lamps 163, a second power to lamps 167 and a third power to lamps 172 and varying the ratio of the first and second powers during the ramping sequence. Blocks 601–604 of FIG. 13 illustrate the steps of ramping the wafer and susceptor temperatures using the apparatus of FIG. 6.

In the above description, numerous specific details were given for the purpose of illustration and not limiting of the present invention. It will be obvious to one skilled in the art that the invention may be practiced without these specific details. Moreover, in some instances, well-known semiconductor equipment and processes have not been set forth in detail in order not to unnecessarily obscure the present invention. Thus, the method and apparatus of the present invention is defined by the appended claims.

A method and apparatus has been described for ramping the temperatures of a wafer and a susceptor by using two or more independently controlled heat sources directed at different radial positions along the wafer and/or susceptor.

We claim:

1. A method for ramping the temperature of a susceptor using a first heat source which most directly influences a central portion of the susceptor and a second heat source which most directly influences an outer portion of the susceptor, said method comprising the steps of:
   a) applying a first power to the first heat source and a second power to the second heat source; and
   b) varying the ratio of the first and second powers during ramping of the susceptor temperature.

2. The method of claim 1 wherein the ramping of the susceptor in step b) is determined by a Proportional Integrated Derivative (PID) ramp.

3. The method of claim 1 wherein the ratio of the first and second powers is controlled by the susceptor temperature in conjunction with utilizing a plurality of power ratios, wherein the plurality of power ratios are stored in a computer.

4. The method of claim 1 further comprising the step of determining a current susceptor temperature during the ramp and using the current susceptor temperature in conjunction with a table of power ratios to vary the ratio of the first and second powers.

5. The method of claim 1 wherein the susceptor is ramped from an initial susceptor temperature to a final susceptor temperature, the ratio of the first and second powers being varied linearly from an initial power ratio at the initial susceptor temperature to a final power ratio at the final susceptor temperature.

6. A method for ramping the temperature of a wafer using a first heat source which most directly influences a central portion of the wafer and a second heat source which most directly influences an outer portion of the wafer, said method comprising the steps of:
   a) applying a first power to the first heat source and a second power to the second heat source; and
   b) varying the ratio of the first and second powers during ramping of the wafer temperature.

7. The method of claim 6 wherein the ramping of the wafer in step b) is determined by a Proportional Integrated Derivative (PID) ramp.

8. The method of claim 6 wherein the ratio of the first and second powers is controlled by the wafer temperature in conjunction with utilizing a plurality of power ratios, wherein the plurality of power ratios are stored in a computer.

9. The method of claim 6 further comprising the step of determining a current wafer temperature during the ramp and using the current wafer temperature in conjunction with a table of power ratios to vary the ratio of the first and second powers.

10. The method of claim 6 wherein the wafer is ramped from an initial wafer temperature to a final wafer temperature, the ratio of the first and second powers being varied linearly from an initial power ratio at the initial wafer temperature to a final power ratio at the final wafer temperature.

11. A method for ramping the temperature of a wafer and a susceptor using a first heat source which most directly influences a central portion of the wafer, a second heat source which most directly influences an outer portion of the wafer, a third heat source which most directly influences a central portion of the susceptor, and a fourth heat source which most directly influences an outer portion of the susceptor, said method comprising the steps of:
   a) applying power to the first, second, third and fourth heat sources;
   b) varying the ratio of the first and second heat source powers during ramping of the wafer temperature; and
   c) varying the ratio of the third and fourth heat source powers during ramping of the susceptor temperature.

12. The method of claim 11 wherein the first and second heat sources make up a first heat assembly and the third and fourth heat sources make up a second heat assembly, the ratio of the first and second heat assembly powers being varied during the ramping of the wafer and susceptor temperatures.

13. The method of claim 11 wherein the ramping of the wafer in step b) is determined by a Proportional Integrated Derivative (PID) ramp.

14. The method of claim 11 wherein the ramping of the susceptor in step c) is determined by a Proportional Integrated Derivative (PID) ramp.

15. The method of claim 11 wherein the power ratio of the first and second heat sources and the power ratio of the third and fourth heat sources are controlled by the susceptor temperature in conjunction with utilizing a first plurality of power ratios corresponding to the first and second heat sources and a second plurality of power ratios corresponding to the third and fourth heat sources, wherein the first and second plurality of power ratios are stored in a computer.

16. The method of claim 11 wherein the power ratio of the first and second heat sources and the power ratio of the third and fourth heat sources are controlled by the wafer temperature in conjunction with utilizing a first plurality of power ratios corresponding to the first and second heat sources and a second plurality of power ratios corresponding to the third and fourth heat sources, wherein the first and second plurality of power ratios are stored in a computer.

17. The method of claim 11 further comprising the step of determining a current temperature of the wafer during the ramp and using the current temperature in conjunction with a table of power ratios to vary the power ratio of the first and second heat sources.

18. The method of claim 11 further comprising the step of determining a current susceptor temperature during the ramp and using the current susceptor temperature in conjunction with a table of power ratios to vary the power ratio of the third and fourth heat sources.

19. The method of claim 11 wherein the wafer is ramped from an initial wafer temperature to a final wafer temperature, the power ratio of the first and second heat sources being varied linearly from an initial power ratio at the initial wafer temperature to a final power ratio at the final wafer temperature.

20. The method of claim 11 wherein the susceptor is ramped from an initial susceptor temperature to a final susceptor temperature, the power ratio of the third and fourth heat sources being varied linearly from an initial power ratio at the initial susceptor temperature to a final power ratio at the final susceptor temperature.

21. A method for ramping the temperature of a wafer and a susceptor using first and second heat assemblies, the first heat assembly including a first heat source which most directly influences a central portion of the wafer and a second heat source which most directly influences an outer portion of the wafer, the second heat assembly including a third heat source which most directly influences a central portion of the susceptor, and a fourth heat source which most directly influences an outer portion of the susceptor, said method comprising the steps of:

a) providing a plurality of first and second heat source power ratios as a function of the wafer temperature;

b) providing a plurality of third and fourth heat source power ratios as a function of the susceptor temperature;

c) applying power to the first heat assembly to heat the wafer from an initial wafer temperature to a final wafer temperature;

d) applying power to the second heat assembly to heat the susceptor from an initial susceptor temperature to a final susceptor temperature;

e) measuring a current wafer temperature during the heating of the wafer;

f) measuring a current susceptor temperature during the heating of the susceptor;

g) varying the power ratio of the first and second heat sources using the current wafer temperature in conjunction with the first plurality of power ratios; and h) varying the power ratio of the third and fourth power ratios using the current susceptor temperature in conjunction with the second plurality of power ratios.

22. The method of claim 21 wherein the ratio of the first and second heat assembly powers is varied during the ramping of the wafer and susceptor temperatures.

23. The method of claim 21 wherein the ramping of the wafer in step g) is determined by a Proportional Integrated Derivative (PID) ramp.

24. The method of claim 21 wherein the ramping of the susceptor in step h) is determined by a Proportional Integrated Derivative (PID) ramp.

25. The method of claim 21 wherein the wafer is ramped from an initial wafer temperature to a final wafer temperature, the power ratio of the first and second heat sources being varied linearly from an initial power ratio at the initial wafer temperature to a final power ratio at the final wafer temperature.

26. The method of claim 21 wherein the susceptor is ramped from an initial susceptor temperature to a final susceptor temperature, the power ratio of the third and fourth heat sources being varied linearly from an initial power ratio at the initial susceptor temperature to a final power ratio at the final susceptor temperature.

27. A method for ramping a wafer and a susceptor from a first temperature to a second temperature using a first heat source which most directly influences the wafer, a second heat source which most directly influences a central portion of the susceptor, and a third heat source which most directly influences an outer portion of the susceptor, said method comprising the steps of:

a) applying a power to the first heat source during ramping of the wafer; and b) varying the ratio of the second and third heat source powers during ramping of the susceptor.

28. A method for ramping a wafer and a susceptor from a first temperature to a second temperature using a first heat source which most directly influences the central portion of the wafer, a second heat source which most directly influences an outer portion of the wafer, and a third heat source which most directly influences the susceptor, said method comprising the steps of:

a) applying a power to the third heat source during ramping of the susceptor; and b) varying the ratio of the first and second heat source powers during ramping of the wafer.

29. An apparatus comprising:

a susceptor having an upper surface and a lower surface, said upper surface configured to hold a wafer;

a first heat source primarily directed to a central portion of said upper surface;

a second heat source primarily directed to an outer portion of the upper surface;

a third heat source primarily directed to a central portion of the lower surface;

a fourth heat source primarily directed to an outer portion of the lower surface;

means for varying the ratio of the first and second heat source powers; and means for varying the ratio of the third and fourth heat source powers.

30. The apparatus of claim 29 wherein the first, second, third and fourth heat sources comprise infrared emitting lamps.

31. The apparatus of claim 29 further comprising a first temperature sensor positioned to detect the temperature of a wafer to be held on the upper surface of the susceptor, the first temperature sensor having an output.

32. The apparatus of claim 29 further comprising a second temperature sensor for detecting the temperature of the lower surface of the susceptor, the second temperature sensor having an output.

33. The apparatus of claim 31 wherein the means for varying the ratio of the first and second heat source powers comprises a controller having as an input the first temperature sensor output.

34. The apparatus of claim 32 wherein the means for varying the ratio of the third and fourth heat source powers comprises a controller having as an input the second temperature sensor output.

35. The apparatus of claim 29 wherein the first and second heat sources make up a first heat assembly and the third and fourth heat sources make up a second heat assembly, the apparatus further comprising means for varying the ratio of the first and second heat assembly powers.

36. An apparatus comprising:

a susceptor having an upper surface and a lower surface, said upper surface configured to hold a wafer;

a first heat source primarily directed to a central portion of the lower surface;

a second heat source primarily directed to an outer portion of the lower surface; and means for varying the ratio of the first and second heat source powers.

37. The apparatus of claim 36 further comprising a third heat source directed to the upper surface of the susceptor.

38. The apparatus of claim 36 further comprising a temperature sensor for detecting the temperature of the lower surface of the susceptor, the temperature sensor having an output.

39. The apparatus of claim 38 wherein the means for varying the ratio of the first and second heat source powers comprises a controller having as an input the temperature sensor output.

40. An apparatus comprising:

a susceptor having an upper surface and a lower surface, said upper surface configured to hold a wafer;

a first heat source primarily directed to a central portion of the upper surface;

a second heat source primarily directed to an outer portion of the upper surface; and means for varying the ratio of the first and second heat source powers.

41. The apparatus of claim 40 further comprising a third heat source directed to the lower surface of the susceptor.

42. The apparatus of claim 40 further comprising a temperature sensor positioned to detect the temperature of a wafer to be held on the upper surface of the susceptor, the temperature sensor having an output.

43. The apparatus of claim 42 wherein the means for varying the ratio of the first and second heat source powers comprises a controller having as an input the temperature sensor output.

44. An apparatus comprising:
- a susceptor having an upper surface and a lower surface, said upper surface configured to hold a wafer;
- a first heat assembly including a first heat source primarily directed to a central portion of said upper surface and a second heat source primarily directed to an outer portion of the upper surface;
- a second heat assembly including a third heat source primarily directed to a central portion of the susceptor; and a fourth heat source primarily directed to an outer portion of the susceptor;
- means for varying the ratio of the first and second heat source powers;
- means for varying the ratio of the third and fourth heat source powers; and
- means for varying the ratio of the first and second heat assemblies.

45. The apparatus of claim 44 further comprising a first temperature sensor positioned to detect the temperature of a wafer to be held on the upper surface of the susceptor, the first temperature sensor having an output.

46. The apparatus of claim 44 further comprising a second temperature sensor for detecting the temperature of the lower surface of the susceptor, the second temperature sensor having an output.

47. The apparatus of claim 45 wherein the means for varying the ratio of the first and second heat source powers comprises a controller having as an input the first temperature sensor output.

48. The apparatus of claim 46 wherein the means for varying the ratio of the third and fourth heat source powers comprises a controller having as an input the first temperature sensor output.

49. The apparatus of claim 44 further comprising a first temperature sensor positioned to detect the temperature of a wafer to be held on the upper surface of the susceptor, the first temperature sensor having an output and a second temperature sensor for detecting the temperature of the lower surface of the susceptor, the second temperature sensor having an output, wherein the means for varying the ratio of the first and second heat assembly powers comprises a controller having as an input the first and second temperature sensor outputs.

50. A program storage device readable by a machine, tangibly embodying a program of instructions executable by said machine to perform method steps for ramping the temperatures of a wafer and a susceptor, said method steps comprising:
- a) providing values of power ratios of a first and second heat source as a function of the temperature of the wafer;
- b) providing values of power ratios of a third and fourth heat source as a function of the temperature of the susceptor temperature;
- c) providing power to the first and second heat sources to ramp the temperature of the wafer from a first wafer temperature to a second wafer temperature;
- d) providing power to the third and fourth heat sources to ramp the temperature of the susceptor from a first susceptor temperature to a second susceptor temperature;
- e) determining a current wafer temperature during the ramping step;
- f) determining a current susceptor temperature during the ramping step;
- g) utilizing the power ratio values of the first and second heat sources and the current wafer temperature to provide power to the first and second heat sources; and
- h) utilizing the power ratio values of the third and fourth heat sources and the current susceptor temperature to provide power to the third and fourth heat sources.

* * * * *